United States Patent
Minami et al.

(10) Patent No.: US 9,908,236 B2
(45) Date of Patent: Mar. 6, 2018

(54) TRANSFER SYSTEM AND TRANSFER METHOD

(71) Applicant: KABUSHIKI KAISHA YASKAWA DENKI, Kitakyushu-shi (JP)

(72) Inventors: Takashi Minami, Fukuoka (JP); Daisuke Shin, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 15/291,069

(22) Filed: Oct. 12, 2016

(65) Prior Publication Data

US 2017/0106533 A1    Apr. 20, 2017

(30) Foreign Application Priority Data

Oct. 15, 2015    (JP) .................................. 2015-203700

(51) Int. Cl.
| | |
|---|---|
| *B25J 9/16* | (2006.01) |
| *H01L 21/677* | (2006.01) |
| *B25J 9/04* | (2006.01) |
| *B25J 11/00* | (2006.01) |
| *B25J 19/02* | (2006.01) |

(52) U.S. Cl.
CPC .............. *B25J 9/163* (2013.01); *B25J 9/042* (2013.01); *B25J 11/0095* (2013.01); *B25J 19/021* (2013.01); *H01L 21/6773* (2013.01); *H01L 21/67706* (2013.01); *H01L 21/67766* (2013.01); *H01L 21/67778* (2013.01); *Y10S 901/03* (2013.01)

(58) Field of Classification Search
CPC .............................. B25J 9/163; H01L 21/6773
See application file for complete search history.

(56) References Cited

U.S. PATENT DOCUMENTS

| | | | |
|---|---|---|---|
| 9,252,035 B2 * | 2/2016 | Furuichi | H01L 21/67766 |
| 9,390,954 B2 * | 7/2016 | Kimura | H01L 21/67265 |
| 9,446,910 B2 * | 9/2016 | Kimura | B65G 47/90 |
| 2014/0350713 A1 * | 11/2014 | Kimura | H01L 21/67265 |
| | | | 700/213 |

FOREIGN PATENT DOCUMENTS

| | | | | |
|---|---|---|---|---|
| JP | 2009136981 A | * | 6/2009 | ........... H01L 21/677 |
| JP | 2009136981 A | * | 6/2009 | |
| JP | 2014-229730 | | 12/2014 | |
| JP | 2014-229757 | | 12/2014 | |
| KR | 10-2014-0137311 | | 12/2014 | |

OTHER PUBLICATIONS

Korean Office Action for corresponding KR Application No. 10-2016-0132714, dated Sep. 8, 2017.

* cited by examiner

*Primary Examiner* — Thomas Randazzo

(74) *Attorney, Agent, or Firm* — Mori & Ward, LLP

(57) ABSTRACT

A transfer system includes a robot including a hand configured to transfer a substrate, a transfer chamber within which the robot is disposed, a plurality of substrate-storing cassettes disposed side by side on a sidewall of the transfer chamber in a plan view, and a robot control device configured to control an operation of the robot based on teaching information. The robot control device includes an operation controller configured to cause the robot to transfer the substrate to a storage position while slanting a hand centerline toward the robot away from a storage centerline with respect to a first cassette and while superimposing the hand centerline on the storage centerline with respect to a second cassette.

16 Claims, 13 Drawing Sheets

TRANSFER SYSTEM AND TRANSFER METHOD

CROSS-REFERENCE TO RELATED APPLICATIONS

The present disclosure contains subject matter related to that disclosed in Japanese Priority Patent Application No. 2015-203700 filed with the Japan Patent Office on Oct. 15, 2015, the entire contents of which are incorporated herein by reference.

BACKGROUND OF THE INVENTION

Field of the Invention

Embodiments disclosed herein relate to a transfer system and a transfer method.

Description of the Related Art

In the related art, there is known a transfer system in which a robot having a hand for holding a substrate is disposed within a locally-cleaned transfer chamber to transfer the substrate to a substrate-storing cassette provided in a sidewall of the transfer chamber or a process chamber.

Furthermore, there has been proposed a transfer system in which when cassettes are disposed side by side in a plan view, a substrate is loaded and unloaded straightforward with respect to each of the cassettes while maintaining the posture of a hand in a direction perpendicular to a front surface, i.e., a transfer-chamber-side surface, of each of the cassettes (see, e.g., Japanese Patent Application Publication No. 2014-229757).

Moreover, there has been proposed a transfer system in which a hand gains access to a cassette while maintaining an oblique posture with respect to a front surface of the cassette and takes a posture perpendicular to a front surface of the cassette when mounting a substrate to the cassette (see, e.g., Japanese Patent Application Publication No. 2014-229730).

SUMMARY OF THE INVENTION

In accordance with an aspect, there is provided a transfer system, including: a robot including a hand configured to transfer a substrate; a transfer chamber within which the robot is disposed; a plurality of substrate-storing cassettes disposed side by side on a sidewall of the transfer chamber in a plan view; and a robot control device configured to control an operation of the robot based on teaching information, wherein a line which interconnects a rotation axis of the hand and a reference position as a center of the substrate in a plan view, is defined as a hand centerline, a line which is perpendicular to a front surface as a transfer chamber side surface of each of the cassettes and which passes through a storage position indicating the center of the substrate stored in each of the cassettes, is defined as a storage centerline, the cassettes include a first cassette and a second cassette, and the robot control device includes an operation controller configured to cause the robot to transfer the substrate to the storage position while slanting the hand centerline toward the robot away from the storage centerline with respect to the first cassette and while superimposing the hand centerline on the storage centerline with respect to the second cassette.

DESCRIPTION OF THE EMBODIMENTS

A transfer system and a transfer method disclosed herein will now be described in detail with reference to the accompanying drawings. However, the present disclosure is not limited by the embodiments described below.

In the embodiments described below, there may be a case where the expressions "parallel", "perpendicular", "vertical", "front", "center" and "symmetrical" are used. However, there is no need to strictly comply with these states. That is to say, the above expressions are intended to permit an error in manufacturing accuracy, installation accuracy, processing accuracy, detection accuracy and the like.

Figure 1:
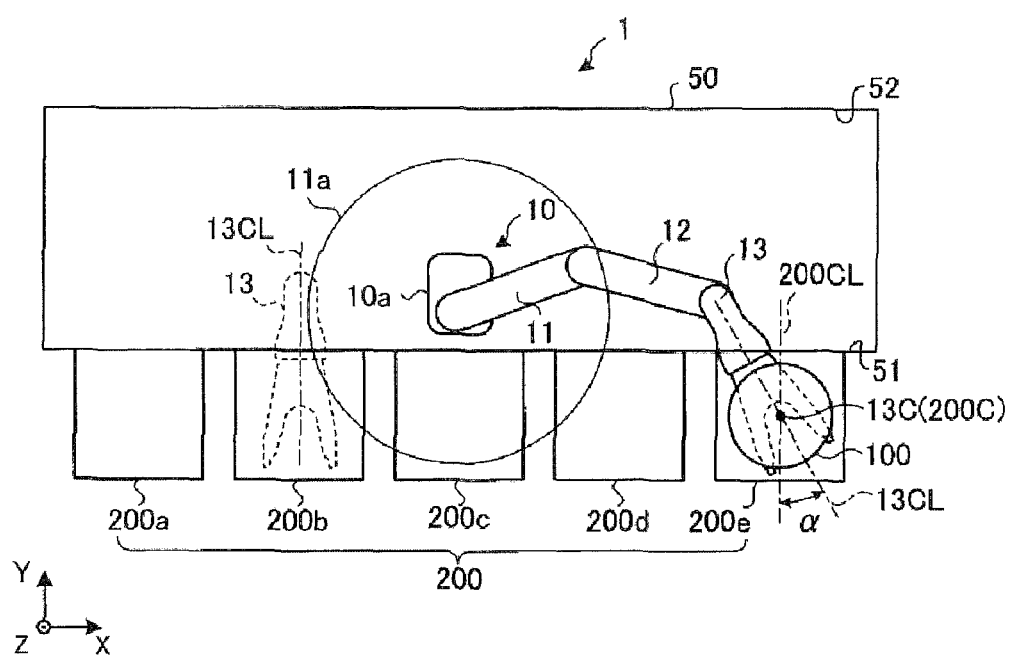
FIG. 1 is a top schematic diagram illustrating an outline of a transfer system.

First, an outline of a transfer system 1 according to one embodiment will be described with reference to FIG. 1. FIG. 1 is a top schematic diagram illustrating an outline of a transfer system 1. In FIG. 1, for the sake of easier understanding of descriptions, there is illustrated a three-dimensional orthogonal coordinate system which indicates a Z-axis having a positive side oriented vertically upward, an X-axis extending along a long side of a transfer chamber 50 and a Y-axis extending along a short side of the transfer chamber 50. Such an orthogonal coordinate system is often illustrated in other figures used in the following descriptions.

As illustrated in FIG. 1, the transfer system 1 includes the transfer chamber 50, a robot 10 and cassettes 200. The transfer chamber 50 is a so-called EFEM (Equipment Front End Module) and is a locally-cleaned housing into which a clean downward airflow is supplied.

The transfer chamber 50 has a rectangular shape with the long side thereof extending in the X-axis direction. The cassettes 200 are disposed side by side on a front sidewall 51, i.e., a front-side sidewall, of the transfer chamber 50.

There may be a case where a process chamber for processing a substrate is provided on a rear sidewall 52, i.e., a rear-side sidewall, a short side (a side extending along the Y-axis in FIG. 1) or at the inside of the short side. In FIG. 1, the illustration of the process chamber is omitted.

In this regard, the position, size and dimension, as an interval or the like, of the openings formed on the front sidewall 51 in order to install the cassettes 200 are in compliance with the SEMI (Semiconductor Equipment and Materials International) standard. In addition, various kinds of dimensions of the cassettes 200 are in compliance with the SEMI standard.

The robot 10 is installed within the transfer chamber and is a so-called three-link horizontal articulated robot including a main body portion 10a, a first arm 11, a second arm 12 and a hand 13. In FIG. 1, there are also illustrated a reference position 13C which is a position corresponding to the center of a substrate 100 held by the hand 13 and a hand centerline 13CL which indicates the orientation of the hand 13. Details of the configurations of the robot 10 and the hand 13 will be described later with reference to FIGS. 2 and 3.

Each of the cassettes 200 is a so-called FOUP (Front-Opening Unified Pod) and is an implement configured to store substrates 100 in multiple stages. The substrates 100 are stored so that the centers thereof lie in a storage position 200C illustrated in FIG. 1. In FIG. 1, a line which is perpendicular to the front surface, i.e., the transfer-chamber-side surface, of each of the cassettes 200 and which passes through the storage position 200C, is defined as a storage centerline 200CL.

As illustrated in FIG. 1, the cassettes 200 are disposed side by side on the front sidewall 51 of the transfer chamber 50. In FIG. 1, there is illustrated a case where five cassettes 200, namely cassettes 200a, 200b, 200c, 200d and 200e, are disposed in the transfer chamber 50.

In the case where the cassettes 200 of odd number are disposed in this way, the robot 10 is disposed at the front side of the central cassette 200 (the cassette 200c in FIG. 1) with a view to enhancing the efficiency of access to each of the cassettes 200.

In order to reduce the short side length of the transfer chamber 50 (the width along the Y-axis in FIG. 1), the robot 10 is installed close to the front sidewall 51 in the direction extending along the Y-axis in FIG. 1. By doing so, the length of each link including the first arm 11 may be set as long as possible within an extent that each link does not make contact with the rear sidewall 52.

In FIG. 1, a minimum turning range 11a of the robot 10 is illustrated for reference. The footprint of the transfer chamber 50 may be reduced by installing the rear sidewall 52 as close to the minimum turning range lie as possible.

Conventionally, when the robot 10 is caused to perform the transfer of the substrate 100 to and from the cassettes 200, it is typical that the substrate 100 is transferred to and from each of the cassettes 200 in a posture in which the hand 13 is kept perpendicular to the front sidewall 51, namely the front surface of each of the cassettes 200.

Furthermore, it is sometimes the case that the substrate 100 is transferred to the front surface of each of the cassettes 200 in a posture in which the hand 13 is inclined with respect to the front surface of each of the cassettes 200. When loading the substrate 100 in each of the cassettes 200, it is typical that the substrate 100 is mounted to the storage position 200C after the hand 13 is made perpendicular to the front surface of each of the cassettes 200.

However, in the case of the cassettes 200 existing in the positions far from the robot 10, such as the cassettes 200a and 200e existing at the opposite ends as illustrated in FIG. 1, it is impossible to make the hand 13 perpendicular to the front sidewall 51 even if the first arm 11 and the second arm 12 are caused to take a stretched posture.

For that reason, if the hand 13 tries to gain access to the cassettes 200a and 200e in a posture perpendicular to the front sidewall 51, it is necessary to increase the length of each link such as the first arm 11 or the like or to increase the number of links. However, it is not desirable to increase the length of each link or the number of links, because costs such as a manufacturing cost and the like may increase in that case.

Thus, as for the cassettes 200a and 200e existing at the opposite sides, the transfer system 1 according to the present embodiment causes the robot 10 to transfer the substrate 100 to the storage position 200C in a state in which the hand centerline 13CL is slanted toward the robot 10 away from the storage centerline 200CL.

Such transfer will be hereinafter referred to as "slant transfer". In the slant transfer, the angle between the hand centerline 13CL and the storage centerline 200CL will be hereinafter referred to as a "slant angle α". In FIG. 1, there is illustrated a state in which the storage position 200O and the reference position 13C of the hand 13 are superimposed by the slant transfer, namely a state in which the substrate 100 is transferred to the storage position 200C.

On the other hand, as for the remaining cassettes 200b, 200c and 200d, the transfer system 1 causes the robot 10 to transfer the substrate 100 to the storage position 200C in a state in which the hand centerline 13CL is superimposed on the storage centerline 200CL. Such transfer will be hereinafter referred to as "perpendicular transfer". In FIG. 1, for reference, the posture of the hand 13 with respect to the cassette 200b during the perpendicular transfer is indicated by a broken line.

In this way, the transfer system 1 switches the "slant transfer" and the "perpendicular transfer" for each of the cassettes 200. This makes it possible to efficiently transfer the substrate 100 without increasing a cost. The cassettes 200a and 200e, to which the slant transfer is applied, may be referred to as first cassettes. The cassettes 200b, 200c and 200d, to which the slant perpendicular transfer is applied, may be referred to as second cassettes. In FIG. 1, there is illustrated a case where the distances between each of the cassettes 200a and 200e existing at the opposite ends and the robot 10 are equal to each other. In the case where the distances differ from each other, the slant transfer may be performed with respect to the distant one of the cassettes 200 existing at the opposite ends.

For example, when four cassettes 200, namely the cassettes 200a, 200b, 200c and 200d illustrated in FIG. 1, are disposed in the transfer chamber 50 and when the robot 10 is disposed at the front side of the second cassette 200c from one end, the slant transfer may be performed with respect to the cassette 200a existing at the other end.

Moreover, for example, when three cassettes 200, namely the cassettes 200b, 200c and 200d illustrated in FIG. 1, are disposed in the transfer chamber 50 and when the robot 10 is disposed at the front side of the central cassette 200c, the slant transfer may be performed with respect to the cassettes 200b and 200d existing at the opposite ends.

The cassettes 200 as targets of the slant transfer are not limited to the cassettes 200 existing at the opposite ends but may be appropriately determined depending on the distance from the robot 10. That is to say, the cassettes 200 existing in the positions other than the opposite ends may be used as the targets of the slant transfer.

For example, the slant transfer may be performed with respect to the cassettes 200b, 200c and 200d illustrated in FIG. 1. This holds true in the case where the number of the cassettes 200 differs from the number illustrated in FIG. 1. As described above, even when the number of the cassettes 200 is several, it may be possible to use the transfer chamber 50 having common short side length and to use the common robot 10.

As the slant angle α, an ideal value may be calculated in advance based on the layout of the robot 10 and the cassettes 200. However, if a design error or an arrangement error exists, the slant angle α may be deviated from the ideal value.

For that reason, in the transfer system 1 according to the present embodiment, a teaching jig for correcting such a deviation is used at a step of performing operation teaching with respect to the robot 10. Details of the teaching jig will be described later with reference to FIG. 6A and other figures.

Figure 2:
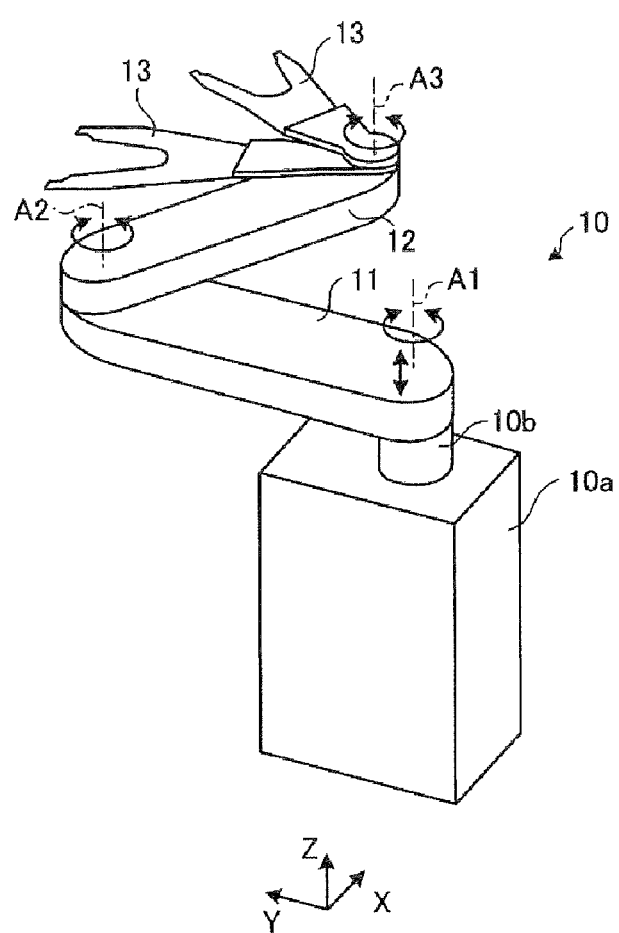
FIG. 2 is a perspective view of a robot.

Next, the configuration of the robot 10 will be described with reference to FIG. 2. FIG. 2 is a perspective view of the robot 10. As illustrated in FIG. 2, the robot 10 includes a main body portion 10a, an elevating shaft 10b, a first arm 11, a second arm 12 and hands 13. In FIG. 2, there is illustrated the robot 10 including two hands 13. However, it may be possible to use one hand 13.

The main body portion 10a is fixed to the floor surface of the transfer chamber 50 (see FIG. 1) and is configured to accommodate an elevator mechanism (not shown) for vertically moving the elevating shaft 10b. The elevating shaft 10b supports the base end portion of the first arm 11 so that the first arm 11 can turn about a first axis A1. The elevating shaft 10b moves up and down along the first axis A1.

The first arm 11 supports, in its distal end portion, the base end portion of the second arm 12 so that the second arm 12 can turn about a second axis A2. The second arm 12 supports, in its distal end portion, the base end portions of the two hands 13 so that the hands 13 can independently turn about a third axis A3. That is to say, the hands 13 are independently turned by a coaxially-disposed turning mechanism (not shown).

As can be noted above, the robot 10 is a three-link horizontal articulated robot including the first arm 11, the second arm 12 and the hands 13. Since the robot 10 is provided with the elevator mechanism as described above, it may be possible for the robot 10 to gain access to each of the substrates 100 disposed within the cassettes 200 in multiple stages.

Moreover, the robot 10 may gain access to, for example, a process chamber (not shown) disposed at a height differing from the height of the cassettes 200 or an aligner (not shown) configured to align the orientation of the substrates 100.

Figure 3:
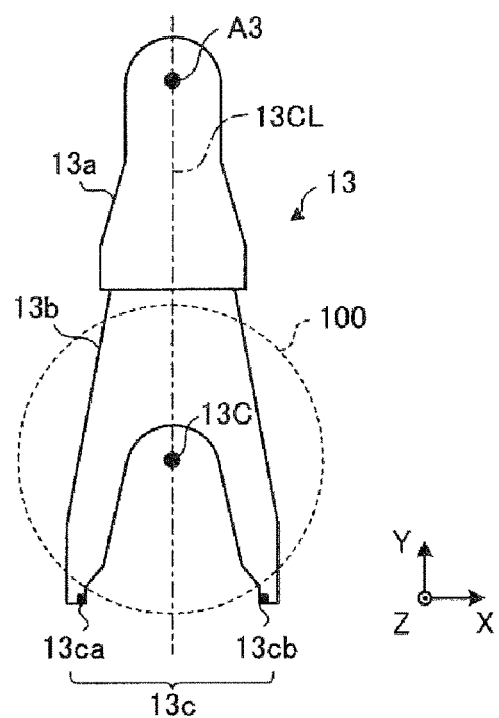
FIG. 3 is a top schematic diagram of a hand.

Next, the hand 13 will be described in more detail with reference to FIG. 3. FIG. 3 is a top schematic diagram of the hand 13. In FIG. 3 and subsequent figures, for the sake of easier understanding of descriptions, only one hand 13 is illustrated.

As illustrated in FIG. 3, the hand 13 includes a base portion 13a and a fork portion 13b. The base end side of the base portion 13a is supported by the second arm 12 (see FIG. 2) so that the hand 13 can turn about the third axis A3. The fork portion 13b is provided at the distal end side of the base portion 13a and is bifurcated into two legs at the distal end side thereof.

A sensor 13c used in inspecting the storage state of the substrate 100 stored in the cassettes 200 is provided at the respective distal end sides of the fork portion 13b bifurcated into two legs. In this regard, the sensor 13c is, for example, an optical sensor, and includes a light transmitting part 13ca disposed at one side and a light receiving part 13cb disposed at the other side. The light receiving part 13cb detects light emitted from the light transmitting part 13ca. The sensor 13c is configured to sense whether the light is cut off by the substrate 100.

As illustrated in FIG. 3, the position corresponding to the center of the substrate 100 held by the hand 13 is the reference position 13C of the hand 13. For example, the line interconnecting the third axis A3 and the reference position 13C is the hand centerline 13CL which indicates the orientation of the hand 13.

The hand centerline 13CL is sufficient as long as it indicates the orientation of the hand 13. For example, a line interconnecting an arbitrary position on the hand 13 set instead of the third axis A3 and an arbitrary reference position 13C on the hand 13 may be used as the hand centerline 13CL.

In this regard, it is assumed that the hand 13 includes a gripping mechanism configured to grip the substrate 100 or a first jig 110 (see FIG. 6A) which will be described later. The hand 13 may include a holding mechanism such as a suction mechanism or the like instead of the gripping mechanism.

Figure 4:
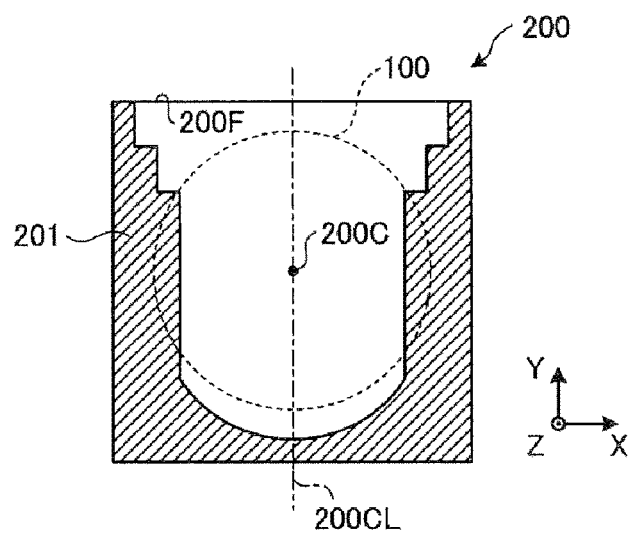
FIG. 4 is a top schematic diagram illustrating an exclusion region of a cassette.

Next, an exclusion region 201 of the cassette 200, into which the entry of the hand 13 is prohibited, will be described with reference to FIG. 4. FIG. 4 is a top schematic diagram illustrating the exclusion region 201 of the cassette 200. The shape and size of the exclusion region 201 are defined by the SEMI standard and, therefore, will not be described herein. In FIG. 4, there are also illustrated the storage position 200C illustrated in FIG. 1, the storage centerline 200CL, the stored substrate 100, and the front surface 200F which is the surface of the cassette 200 facing the transfer chamber 50 (see FIG. 1).

As illustrated in FIG. 4, the exclusion region 201 has a line symmetry shape with respect to the storage centerline 200CL. The exclusion region 201 corresponds to a region where a multi-stage support mechanism for holding the substrate 100 is disposed. The entry of the hand 13 (see FIG. 3) into the exclusion region 201 is prohibited by the SEMI standard.

That is to say, when the substrate 100 is transferred to the cassette 200 by the slant transfer, teaching is performed with respect to the robot 10 so that the substrate 100 is transferred to the storage position 200C with no entry of the hand 13 into the exclusion region 201.

Figure 5:
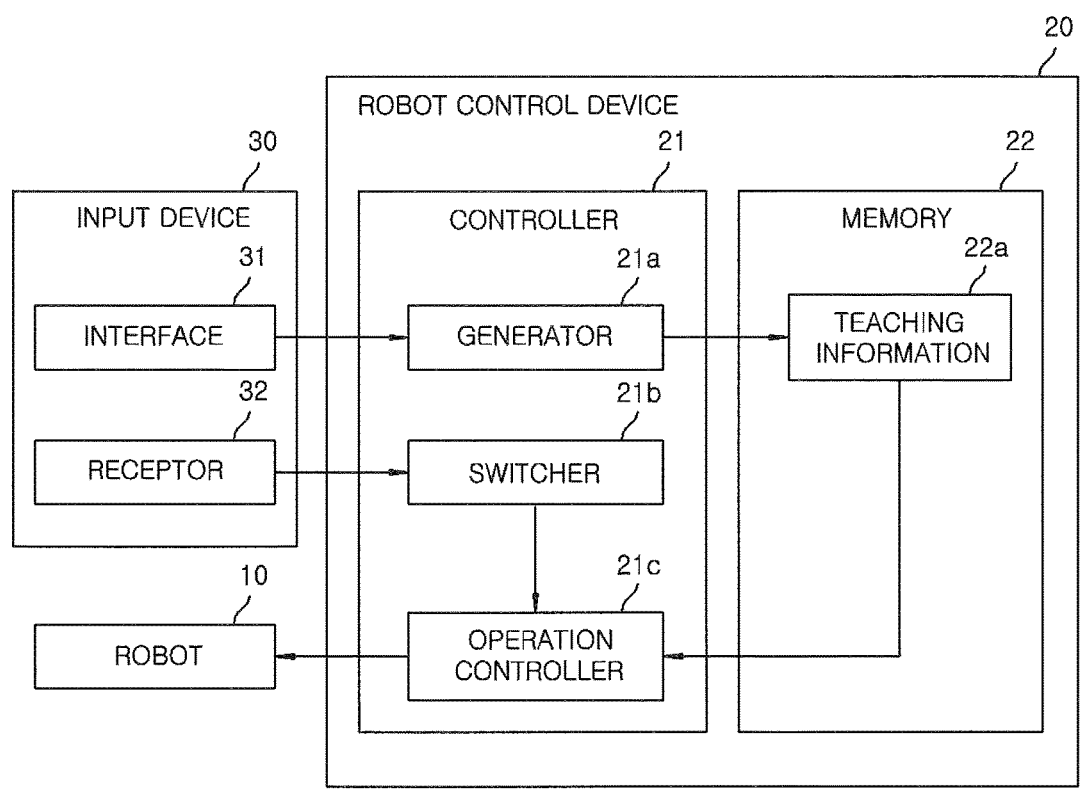
FIG. 5 is a block diagram of a robot control device.

Next, a robot control device 20 for controlling the operation of the robot 10 (see FIG. 2) will be described with reference to FIG. 5. FIG. 5 is a block diagram of the robot control device 20. In FIG. 5, there is also illustrated an input device 30 which is a terminal device such as a so-called pendant or the like connected to the robot control device 20. In the following descriptions, there may be a case where the robot control device 20 and the input device 30 are collectively referred to as a robot control device 20.

As illustrated in FIG. 5, the robot control device 20 includes a controller 21 and a memory 22. The controller 21 includes a generator 21a, a switcher 21b and an operation controller 21c. The memory 22 stores teaching information 22a.

In this regard, the robot control device 20 includes a computer provided with, for example, a CPU (Central Processing Unit), a ROM (Read Only Memory), a RAM (Random Access Memory), a HDD (Hard Disk Drive), an input/output port and the like, and various kinds of circuits.

For example, the CPU of the computer reads and executes a program stored in the ROM, thereby serving as the generator 21a, the switcher 21b and the operation controller 21c of the controller 21.

At least one or all of the generator 21a, the switcher 21b and the operation controller 21c of the controller 21 may be composed of hardware such as an ASIC (Application Specific Integrated Circuit), an FPGA (Field Programmable Gate Array) or the like.

The memory 22 corresponds to, for example, the RAM or the HDD. The RAM or the HDD may store the teaching information 22a. The robot control device 20 may acquire the aforementioned program or various kinds of information via another computer connected through a wire or a wireless network, or a portable recording medium.

The input device 30 includes an interface 31 and a receptor 32. Similar to the robot control device 20, the input device 30 may be composed of a computer or various kinds of circuits.

The controller 21 of the robot control device 20 generates the teaching information 22a of the robot 10 and controls the operation of the robot 10 based on the teaching information 22a.

Based on the information inputted from the interface 31 of the input device 30, the generator 21a generates the teaching information 22a, such as a movement locus of the hand 13 or the like, which defines the operation of the robot 10. In this regard, the interface 31 of the input device 30 is an input device, such as a touch panel display, a ten key or the like, which is configured to receive the aforementioned slant angle $\alpha$ or a correction value for the slant angle $\alpha$. In addition, the interface 31 is also configured to receive a relief angle $\beta$ (see FIG. 9B or the like) which will be described later.

The generator 21a automatically generates an intermediate position P1 (see FIG. 9B) and a standby position P2 (see FIG. 9C), which will be described later, based on the teaching result of the storage position 200C with respect to the robot 10. On this point, descriptions will be made later with reference to FIGS. 9A to 9C.

The switcher 21b performs the switching of a coordinate system set on the hand 13 (see FIG. 3), based on the information received by the receptor 32 of the input device 30. In this regard, the receptor 32 of the input device 30 is an input device, such as a touch panel display, a switching button or the like, which receives the switching of a coordinate system. Details of the switching of a coordinate system will be described later with reference to FIG. 11.

The operation controller 21c instructs actuators (not shown) corresponding to the respective axes of the robot 10, based on the teaching information 22a generated by the generator 21a and stored in the memory 22, thereby enabling the robot 10 to perform the transfer of the substrate 100. Furthermore, the operation controller 21c enhances the operation accuracy of the robot 10 by executing feedback control through the use of encoder values of the actuators.

The teaching information 22a is information which is generated by the generator 21a at a teaching step of teaching the operation of the robot 10 and which includes a "job" as a program that defines the operation of the robot including a movement locus of the hand 13. Rough teaching information 22a may be generated in another computer connected via a wire or a wireless network and may be stored in the memory 22. Then, such teaching information 22a may be corrected.

In this case, the rough teaching information 22a is generated based on the positional relationship between the robot 10, the transfer chamber 50 and the cassettes 200. Then, an operator corrects the operation of the robot 10 through the use of the input device 30 while operating the robot 10 based on the rough teaching information 22a. Thus, the generator 21a generates final teaching information 22a.

As described above, when teaching a movement locus to the robot 10, the robot 10 is taught so as to perform the slant transfer at a desire slant angle $\alpha$. However, in reality, there may be a case where, due to an installation error or the like of the transfer chamber 50 or the robot 10, the angle of the hand 13 with respect to the cassette 200 in the slant transfer is deviated from a desire slant angle $\alpha$.

Thus, in the transfer system 1 according to the present embodiment, teaching jigs is used in order to accurately detect such a deviation. The teaching jigs include a first jig 110 transferred by the hand 13 instead of the substrate 100 and a second jig 210 installed in the transfer chamber 50 instead of the cassette 200.

Hereinafter, the first jig 110 will be described in detail with reference to FIGS. 6A to 6C and the second jig 210 will be in detail with reference to FIGS. 7A to 7C.

First, the first jig 110 will be described with reference to FIGS. 6A to 6C. FIG. 6A is a top schematic diagram of the first jig 110. FIG. 6B is a view illustrating modification 1 of the first jig 110. FIG. 6C is a view illustrating modification 2 of the first jig 110.

Figure 6A:
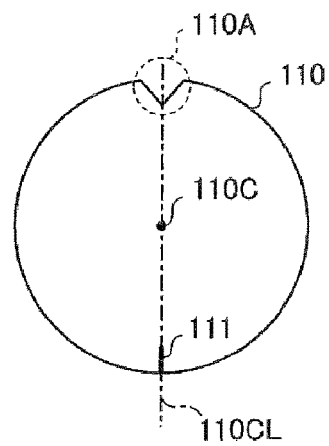
FIG. 6A is a top schematic diagram of a first jig.

As illustrated in FIG. 6A, the first jig 110 has shape that resembles the substrate 100. The first jig 110 includes a first mark 111 disposed on a centerline 110CL which passes through the center of a notch 110A and the center 110C of the first jig 110. It is preferred that the first mark 111 has a visually-recognizable size, shape or color. In the case where the first mark 111 is detected by a sensor, the first mark 111 may have a size, shape or color detectable by the sensor. The notch 110A has a cutout shape for use in aligning the orientation of the substrate 100.

In this regard, the hand 13 (see FIG. 3) holds and transfers the first jig 110 so that the notch 110A is positioned at the side of the base portion 13a and so that the hand centerline 13CL and the centerline 110CL of the first jig 110 are superimposed. That is to say, the first mark 111 exists on the hand centerline 13CL. Thus, the first mark 111 indicates the orientation of the hand 13.

In FIG. 6A, there is illustrated a case where the first mark 111 exists in the outer periphery portion of the first jig 110 at the opposite side from the notch 110A. However, it is not necessary for the first mark 111 to reach the outer edge of the first jig 110. That is to say, as long as the first mark 111 can be compared with a second mark 214 (see FIG. 7B) of the second jig 210 which will be described later, the first mark 111 may exist inward of the outer edge without having to reach the outer edge.

The first mark 111 is not limited to the line segment shape illustrated in FIG. 6A but may be a mark having a dot shape, a triangular shape or the like. Moreover, the first mark 111 may have the shape of a line reaching the notch 110A. In addition, the centerline 110CL illustrated in FIG. 6A may be a visually-recognizable mark just like the first mark 111.

Figure 6B:
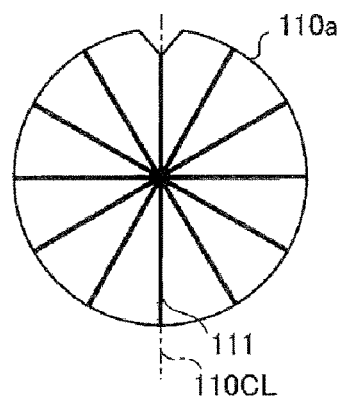
FIG. 6B is a view illustrating modification 1 of the first jig.

In FIG. 6B, there is illustrated a first jig 110a which is modification 1 of the first jig 110. As illustrated in FIG. 6B, a plurality of first marks 111 having the shape of a radial line passing through the centerline 110CL (see FIG. 6A) may be arranged at a predetermined angle relative to each other. In FIG. 6B, there is illustrated a case where the first marks 111 are arranged at 30 degrees. However, this angle may be an arbitrary angle. In addition, the line disposed in the position corresponding to the first mark 111 illustrated in FIG. 6A may have a thickness or a color differing from the thickness or the color of the other lines.

Figure 6C:
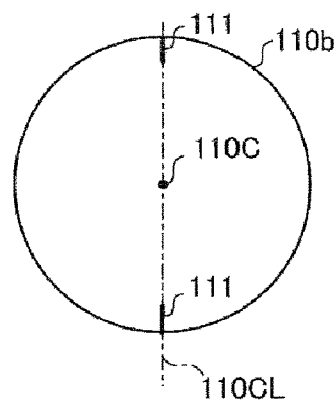
FIG. 6C is a view illustrating modification 2 of the first jig.

In FIG. 6C, there is illustrated a first jig 110*b* which is modification 2 of the first jig 110. As illustrated in FIG. 6C, a first mark 111 may be provided instead of the notch 110A illustrated in FIG. 6A. In FIG. 6C, there is illustrated a case where two first marks 111 are provided in the outer periphery portion on the centerline 110CL of the first jig 110*b*. A solid line or a broken line interconnecting the two first marks 111 may be used.

That is to say, the shape or position of the first marks 111 may be an arbitrary one, as long as the first marks 111 can indicate the orientation of the hand 13 in a state in which the first jig 110 is held in the hand 13 and as long as the first marks 111 can be compared with the second mark 214 (see FIG. 7B) of the second jig 210 which will be described later.

The notch 110A illustrated in FIGS. 6A and 6B may be a so-called orientation flat or may be omitted as illustrated in FIG. 6C. In the present embodiment, there has been described a case where the first jig 110 is held and transferred by the hand 13. Alternatively, the first j g 110 may be fixed to the hand 13.

Next, the second jig 210 will be described with reference to FIGS. 7A to 7C. FIG. 7A is a perspective view of the second jig 210. FIG. 7B is a top schematic diagram of the second jig 210. FIG. 7C is a view illustrating a modification of the second jig 210.

In this regard, the second jig 210 is installed at the transfer chamber 50 (see FIG. 1) instead of the cassette 200 which is subjected to the slant transfer. Hereinafter, descriptions will be made on a case where the second jig 210 is provided instead of the cassette 200*e* illustrated in FIG. 1.

Figure 7A:
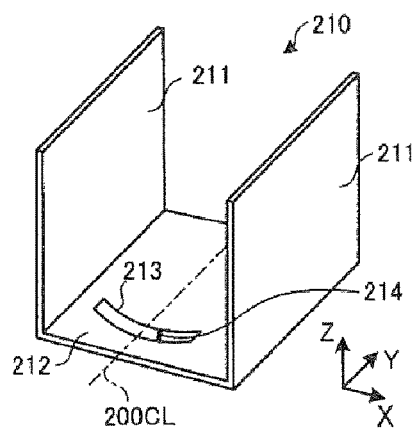
FIG. 7A is a perspective view of a second jig.

As illustrated in FIG. 7A, the second jig 210 includes a pair of sidewalls 211 and a bottom wall 212 configured to interconnect the respective sidewalls 211. Furthermore, as illustrated in FIG. 7A, the upper side of the second jig 210 is opened. This is to make sure that an operator who performs teaching of the robot 10 can easily see the first jig 110 and the second jig 210.

The inner surfaces (the surfaces existing at the side of the storage centerline 200CL) of the respective sidewalls 211 may have a shape which resembles the exclusion region 201 illustrated in FIG. 4. In this case, it becomes easy to teach a movement locus which prevents entry of the hand 13 into the exclusion region 201.

An arc-shaped region 213 including a second mark 214 and having, for example, the same diameter as the substrate 100 is provided in the bottom wall 212. By forming the region 213 in an arc shape so as to have the same diameter as the substrate 100 in this way, it becomes easy to align the outer edge of the substrate 100 with the region 213. In this regard, the region 213 may be a component such as a plate or the like fixed to the bottom wall 212 or may be a pattern provided in the bottom wall 212. By using a component removably mounted to the bottom wall 212 as the region 213, it becomes easy to change the position of the second mark 214 depending on the position of the corresponding cassette 200.

The region 213 and the second mark 214 will be described in more detail with reference to FIG. 7B. In FIG. 7B, there is illustrated a state in which the first jig 110 illustrated in FIG. 6A has been transferred to the storage position 200C at a desired slant angle α by the hand 13.

Figure 7B:
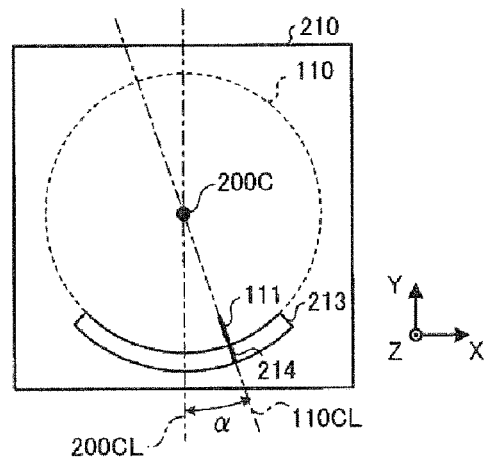
FIG. 7B is a top schematic diagram of the second jig.

As illustrated in FIG. 7B, the second mark 214 of the second jig 210 is provided in the position in which the second mark 214 faces the first mark 111 of the first jig 110 transferred at a desired slant angle α. That is to say, the second mark 214 is provided in a predetermined position for the comparison with the first mark 111, thereby indicating the orientation of the second jig 210, namely the orientation of the cassette 200.

In this regard, as illustrated in FIG. 7B, the region 213 is provided in the position in which the region 213 extends along the outer edge of the first jig 110. By doing so, it is possible to easily determine whether the substrate 100 reaches the storage position 200C. Alternatively, the region 213 may be provided in the position in which a portion of the region 213 is hidden by the first jig 110, or the region 213 may be provided in the position spaced apart outward from the outer edge of the first jig 110.

By providing the second mark 214 in the position illustrated in FIG. 7B, it is possible to accurately and easily confirm that the hand 13 reaches the storage position 200C at a desired slant angle α. That is to say, it is possible to accurately and easily determine whether the angle between the centerline 110CL of the first jig 110 and the storage centerline 200CL is equal to the slant angle α.

Figure 7C:
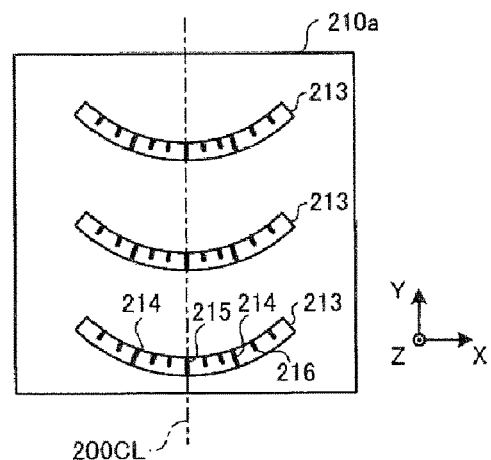
FIG. 7C is a view illustrating a modification of the second jig.

In FIG. 7C, there is illustrated a second jig 210*a* which is a modification of the second jig 210. As illustrated in FIG. 7C, in the region 213, two second marks 214 are provided in the positions symmetrical with respect to the storage centerline 200CL. By doing so, the second jig 210*a* may be used in teaching, for example, with respect to the cassette 200*a* illustrated in FIG. 1.

In FIG. 7C, a third mark 215 is provided in addition to the second marks 214. In this regard, the third mark 215 is provided in the position in which the third mark 215 is superimposed on the storage centerline 200CL. By providing the third mark 215 in this way, it becomes easy to determine whether the reference position 13C of the hand 13 exists on the storage centerline 200CL.

Furthermore, as illustrated in FIG. 7C, for example, scales 216 such as a protractor or the like may be provided in the region 213. By doing so, it may be possible to confirm a deviation angle deviated from the desired slant angle α. By inputting the deviation angle through, for example, the interface 31 illustrated in FIG. 5, it may be possible to easily perform correction of the deviation angle.

In FIG. 7C, the second marks 214, the third mark 215 and the scales 216 are designated by separate reference numerals. However, the second marks 214 and the third mark 215 may be configured as a portion of the scales 216. For example, one of the scales 216 having regular intervals may be used as the second mark 214 or the third mark 215.

Furthermore, as illustrated in FIG. 7C, a plurality of regions 213 may be arranged along the storage centerline 200CL. By doing so, it may be possible to easily confirm the movement locus of the hand 13 which moves close to or away from the storage position 200C. In FIG. 7C, there is illustrated a case where three regions 213 are provided. However, the number of the regions 213 may be an arbitrary number, i.e., one or more.

Figure 8A:
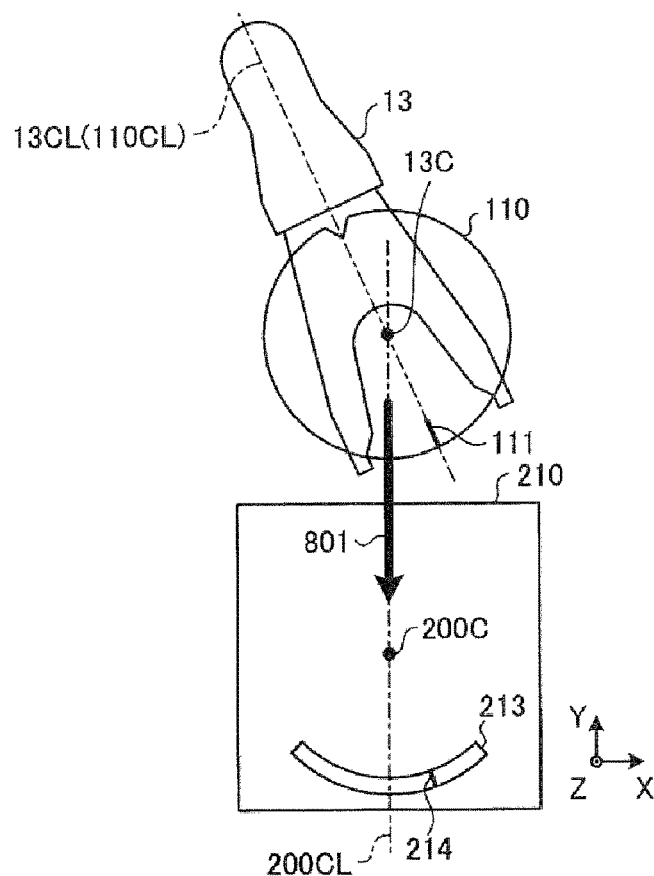
FIG. 8A is a view illustrating teaching procedure 1 with respect to a cassette serving as a target of slant transfer.
Figure 8B:
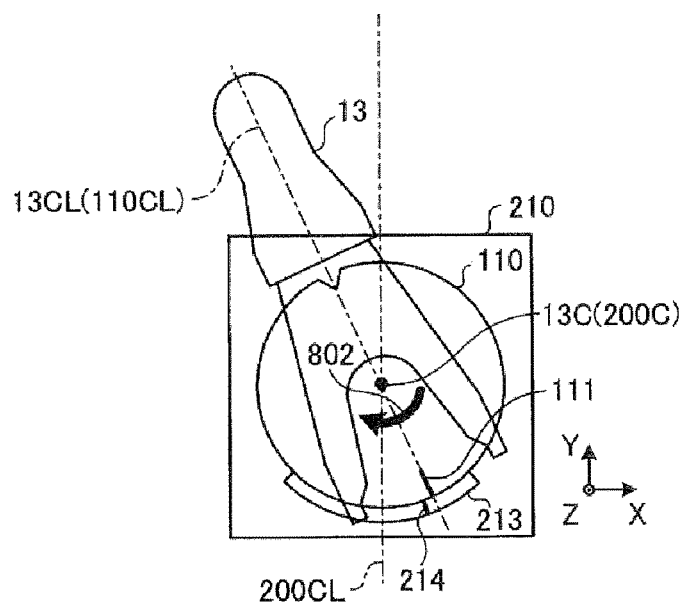
FIG. 8B is a view illustrating teaching procedure 2 with respect to a cassette serving as a target of slant transfer.

Next, a teaching procedure with respect to the cassette 200 (e.g., the cassette 200*e*) serving as a target of the slant transfer will be described with reference to FIGS. 8A and 8B. FIG. 8A is a view illustrating teaching procedure 1 with respect to the cassette 200 serving as a target of the slant transfer. FIG. 8B is a view illustrating teaching procedure 2 with respect to the cassette 200 serving as a target of the slant transfer. Hereinafter, descriptions will be made on a case where an operator performs the teaching for the cassette 200 serving as a teaching target while finely adjusting the position of the hand 13 through the use of the input device 30 illustrated in FIG. 5.

In FIGS. 8A and 8B, the first jig 110 is held by the hand 13 and the second jig 210 is installed at the transfer chamber 50 instead of the cassette 200 serving as a teaching target.

As illustrated in FIG. 8A, the first jig 110 is held by the hand 13 so that the centerline 110CL of the first jig 110 is superimposed on the hand centerline 13CL. An operator finely adjusts the X-axis direction position of the hand 13 so that the reference position 13C of the hand 13 exists on the storage centerline 200CL of the cassette 200. Then, the hand 13 is moved in the direction 801 conforming to the negative direction of the Y-axis while maintaining the angle of the hand 13 with respect to the second jig 210.

As illustrated in FIG. 8B, the hand 13 is moved to the position where the outer edge of the first jig 110 reaches the inner circumference of the region 213, whereby the reference position 13C of the hand 13 coincides with the storage position 200C. That is to say, the hand 13 reaches the storage position 200C.

In this regard, if a deviation exists between the first mark 111 of the first jig 110 and the second mark 214 of the second jig 210 as illustrated in FIG. 8B, it means that the hand 13 and the second jig 210 are deviated from an ideal positional relationship.

In this case, an operator rotates the hand 13 about the reference position 13C in the direction 802 illustrated in FIG. 8B until the first mark 111 and the second mark 214 face each other. By doing so, the angle of the hand 13 with respect to the second jig 210 becomes a desired slant angle $\alpha$ (see FIG. 7B).

In this state, an operator stores the current position and posture of the hand 13 in the robot control devicer 20 through the input device 30. By doing so, the storage position 200C of the cassette 200 serving as a target of the slant transfer may be taught to the robot 10.

By rotating the hand 13 about the reference position 13C rather than the third axis A3, the hand 13 and the cassette 200 (including the exclusion region 201) are difficult to interfere with each other. It is therefore possible to easily perform a teaching work.

Next, details of a process in which the generator 21a of the robot control device 20 illustrated in FIG. 5 generates an intermediate position P1 and a standby position P2 based on the teaching result of the storage position 200C to the robot 10 will be described with reference to FIGS. 9A to 9C.

Figure 9A:
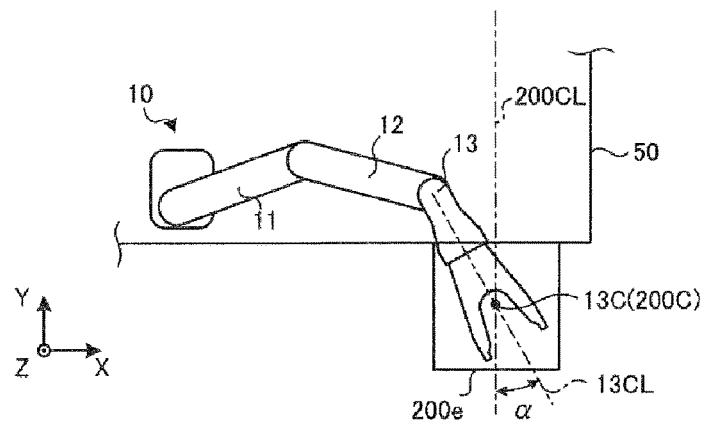
FIG. 9A is a view illustrating a state in which the teaching of a storage position is completed.

FIG. 9A is a view illustrating a state in which the teaching of the storage position 200C is completed. FIG. 9B is a view illustrating the intermediate position P1 generated based on the storage position 200C. FIG. 9C is a view illustrating the standby position P2 generated based on the storage position 200C. In FIGS. 9A to 9C, there is illustrated a case where the cassette 200 serving as a teaching target is the cassette 200e (see FIG. 1).

As illustrated in FIG. 9A, when the teaching of the storage position 200C is completed, the reference position 13C of the hand 13 coincides with the storage position 200C of the cassette 200e. The angle between the hand centerline 13CL of the hand 13 and the storage centerline 200CL of the cassette 200e is a slant angle $\alpha$.

Figure 9B:
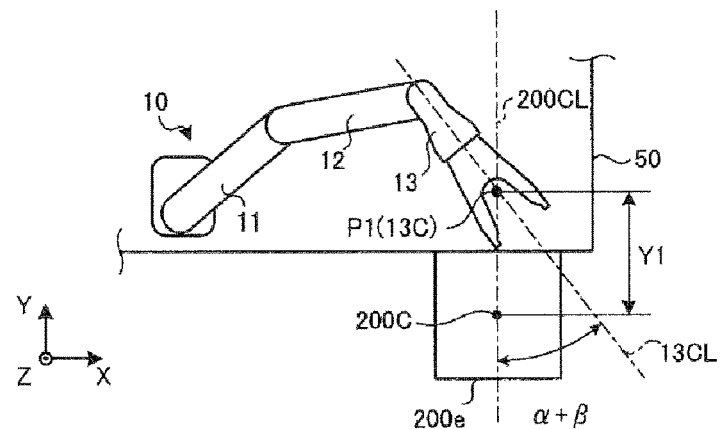
FIG. 9B is a view illustrating an intermediate position generated based on the storage position.

As illustrated in FIG. 9B, the generator 21a generates the intermediate position P1 based on the position and posture of the hand 13 illustrated in FIG. 9A. Specifically, as illustrated in FIG. 9B, the generator 21a sets as the intermediate position P1 a position obtained by shifting the storage position 200C in the positive direction of the Y-axis by a predetermined shift amount Y1.

Furthermore, the generator 21a generates, as the posture of the hand 13 in the intermediate position P1, the posture obtained by adding a predetermined relief angle $\beta$ to the slant angle $\alpha$ of the hand 13. That is to say, the angle between the hand centerline 13CL and the storage centerline 200CL in the intermediate position P1 is equal to "the slant angle $\alpha$+the relief angle $\beta$".

The term "relief angle $\beta$" used herein refers to an angle at which the first arm 11 and the second arm 12 of the robot 10 do not take a stretched posture in the intermediate position P1, namely an angle at which the first axis A1, the second axis A2 and the third axis A3 illustrated in FIG. 2 do not exist on a single line.

In this regard, if the relief angle $\beta$ is added to the slant angle $\alpha$, the hand 13 is further slanted toward the robot 10. If the hand 13 takes such a posture in the intermediate position P1, it is possible to perform an operation in which the hand 13 avoids the right upper area of the transfer chamber 50 in FIG. 9B. For example, if an obstacle or a process chamber is provided in the right upper area of the transfer chamber 50 in FIG. 9B, the relief angle $\beta$ may be set at a value which enables the hand 13 to avoid the installation area of the obstacle or the process chamber.

When the robot 10, to which the teaching has been completed, is actually operated, between the storage position 200C and the intermediate position P1, the hand 13 displaces the reference position 13C along the Y-axis by Y1 while rotating about the reference position 13C by the relief angle $\beta$.

In order to operate the hand 13 in this way, the first arm 11, the second arm 12 and the hand 13 perform a collaborative operation. Such a collaborative operation is performed based on the instructions from the operation controller 21c of the robot control device 20.

If the Y-axis direction length of the transfer chamber 50 is large with a margin left in the arm length of the robot 10 or if there is no need to consider the installation area of the obstacle or the like, it may be possible to omit the generation of the intermediate position P1 illustrated in FIG. 9B.

Figure 9C:
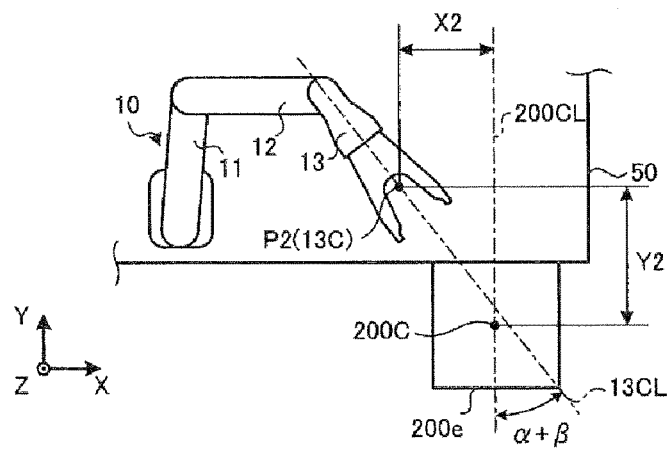
FIG. 9C is a view illustrating a standby position generated based on the storage position.

As illustrated in FIG. 9C, the generator 21a generates the standby position P2 based on the position and posture of the hand 13 illustrated in FIG. 9A. Specifically, as illustrated in FIG. 9C, the generator 21a sets as the standby position P2 a position obtained by shifting the storage position 200C in the negative direction of the X-axis by a predetermined shift amount X2 and in the positive direction of the Y-axis by a predetermined shift amount Y2.

Furthermore, the generator 21a generates, as the posture of the hand 13 in the standby position P2, the same posture as the posture of the hand 13 in the intermediate position P1 illustrated in FIG. 9B. That is to say, as with the intermediate position P1, the angle between the hand centerline 13CL and the storage centerline 200CL in the standby position P2 is equal to "the slant angle $\alpha$+the relief angle $\beta$".

The term "standby position P2" used herein refers to a position where the hand 13 holding the substrate 100 can be turned about the third axis A3 (see FIG. 3) without causing the substrate 100 to interfere with an obstacle such as the inner wall of the transfer chamber 50 or the like. When the robot 10, to which the teaching has been completed, is actually operated, the hand 13 is moved between the intermediate position P1 and the standby position P2 while maintaining the orientation of the hand centerline 13CL with respect to the transfer chamber 50.

If the intermediate position P1 and the standby position P2 satisfy a predetermined condition when generating the intermediate position P1 and the standby position P2, the generator 21a performs notification of an error, a warning or the like. Specifically, the rotation angles of the first axis A1, the second axis A2 and the third axis A3 of the robot 10 illustrated in FIG. 2 are calculated in the intermediate position P1 and the standby position P2. Determination is made as to whether the rotation angles fall within a predetermined rotation permission range.

If one of the rotation angles of the first axis A1, the second axis A2 and the third axis A3 does not fall within the rotation permission range, the notification of an error, a warning or the like is performed and the generation of the intermediate position P1 and the standby position P2 is stopped.

If the generation of the intermediate position P1 and the standby position P2 is stopped in this way, an operator re-inputs the changed values of the shift amounts Y1, X2 and Y2 illustrated in FIGS. 9B and 9C, through the interface 31 of the input device 30. The generator 21a re-generates an intermediate position P1 and a standby position P2 based on the re-inputted values.

The notification of an error, a warning or the like may be displayed on the touch panel display of the input device 30, or may be performed by a warning device (not shown) which generates a voice or flickers light. The warning device may be provided on the input device 30, or may be provided in a work area of an operator.

Next, details of a process in which the generator 21a of the robot control device 20 illustrated in FIG. 5 generates a mapping position P3 based on the teaching result of the storage position 200C to the robot 10 will be described with reference to FIG. 10.

Figure 10:
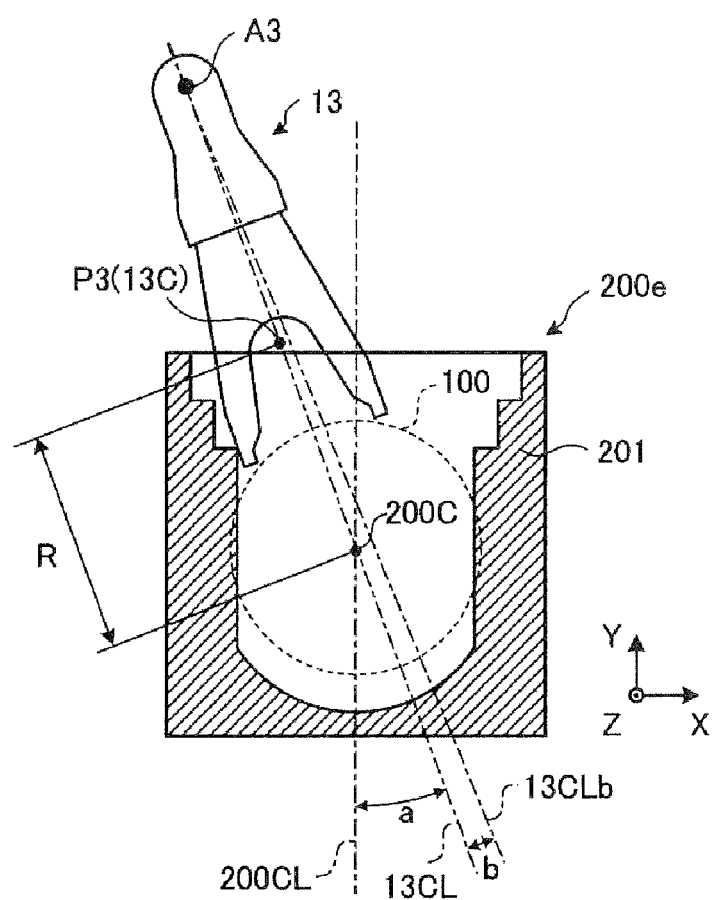
FIG. 10 is a view illustrating a mapping position generated based on the storage position.

FIG. 10 is a view illustrating the mapping position P3 generated based on the storage position 200C. In FIG. 10, there is illustrated a case where the cassette 200 serving as a teaching target is the cassette 200e (see FIG. 1). In FIG. 10, there is also illustrated the exclusion region 201 illustrated in FIG. 4.

As illustrated in FIG. 10, the generator 21a generates the mapping position P3 based on the position and posture of the hand 13 illustrated in FIG. 9A. Specifically, as illustrated in FIG. 10, the generator 21a generates the mapping position P3 by rotating the hand 13 about the storage position 200C by an angle a and drawing the hand 13 away from the storage position 200C by a shift amount R.

The term "angle a" used herein refers to an angle at which the first arm 11 and the second arm 12 of the robot 10 do not take a stretched posture, namely an angle at which the first axis A1, the second axis A2 and the third axis A3 illustrated in FIG. 2 do not exist on a straight line. The angle a may be set equal to the slant angle α illustrated in FIG. 9A.

The shift amount R is a value which is adjusted to make sure that the hand 13 does not interfere with the substrate 100 stored in the storage position 200C and further that the sensor 13c illustrated in FIG. 3 lies in a position where the sensor 13c can sense the substrate 100.

In this regard, if the angle a and the shift amount R are applied, the hand 13 is rotated counterclockwise about the third axis A3 by an angle b in the case where the hand 13 interferes with the exclusion region 201. In FIG. 10, for reference, the hand centerline 13CL rotated by the angle b is illustrated as a hand centerline 13CLb. This makes it possible to automatically generate the mapping position P3 where the hand 13 does not interfere with the exclusion region 201 and where the sensor 13c can sense the substrate 100. The mapping position P3 is also referred to as an inspection position. When the hand 13 reaches the mapping position P3, the storage state of the substrate 100 may be inspected by the sensor 13c (see FIG. 3) of the hand 13. The generator 21a (see FIG. 5) of the robot control device may generate teaching information including such an inspection position based on the exclusion region 201 and the storage position 200C.

Figure 11:
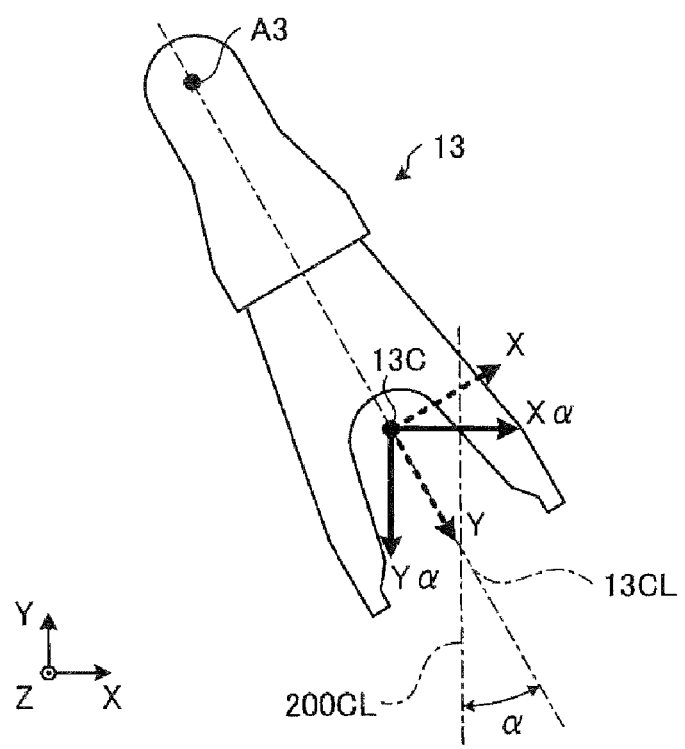
FIG. 11 is a view illustrating a first orthogonal coordinate system and a second orthogonal coordinate system.

Next, details of a process in which the switcher 21b of the robot control device 20 illustrated in FIG. 5 switches a coordinate system set on the hand 13 (see FIG. 3) will be described with reference to FIG. 11. FIG. 11 is a view illustrating a first orthogonal coordinate system and a second orthogonal coordinate system. Hereinafter, descriptions will be made on the switching of a coordinate system in the case of performing the teaching by which the hand 13 is caused to gain access to the cassette 200 at a slant angle α.

In the case where the hand 13 is manually moved during a teaching work, there is used an XY coordinate system (first orthogonal coordinate system) in which the reference position 13C of the hand 13 serves as an origin as illustrated in FIG. 11. However, if the first orthogonal coordinate system is used when the hand centerline 13CL is slanted by a slant angle α with respect to the storage centerline 200CL as illustrated in FIG. 11, it is necessary to simultaneously perform an instruction of movement in the X-axis direction of the first orthogonal coordinate system and an instruction of movement in the Y-axis direction of the first orthogonal coordinate system in order to move the hand 13 in the X-axis direction of the XYZ coordinate system illustrated in FIG. 11.

In the case where the instructions in two directions are performed in this way, it is difficult for an operator to perform an operation, eventually making it difficult to smoothly perform a teaching work. Thus, in the robot control device 20 according to the present embodiment, the first orthogonal coordinate system and the second orthogonal coordinate system may be switched to each other.

As illustrated in FIG. 11, the second orthogonal coordinate system is an XαYα coordinate system obtained by rotating the first orthogonal coordinate system about the reference position 13C of the hand 13 until the turning angle α becomes 0. By using the second orthogonal coordinate system in this way, when the hand 13 is moved in the X-axis direction of the XYZ coordinate system illustrated in FIG. 11, it is only necessary to perform an instruction of movement in the Xα-axis direction of the second orthogonal coordinate system. Thus, the operation is simplified. Furthermore, even when the hand 13 is moved in the Y-axis direction of the XYZ coordinate system, it is only necessary to perform an instruction of movement in the Yα-axis direction of the second orthogonal coordinate system. Thus, the operation is similarly simplified.

As described above, in the robot control device 20, if necessary, the first orthogonal coordinate system and the second orthogonal coordinate system may be switched to each other. It is therefore possible to efficiently perform a teaching work. The switching of the coordinate system may be performed using the input device 30 illustrated in FIG. 5. It is therefore possible to easily perform a teaching work while confirming the position of the hand 13.

Figure 12:
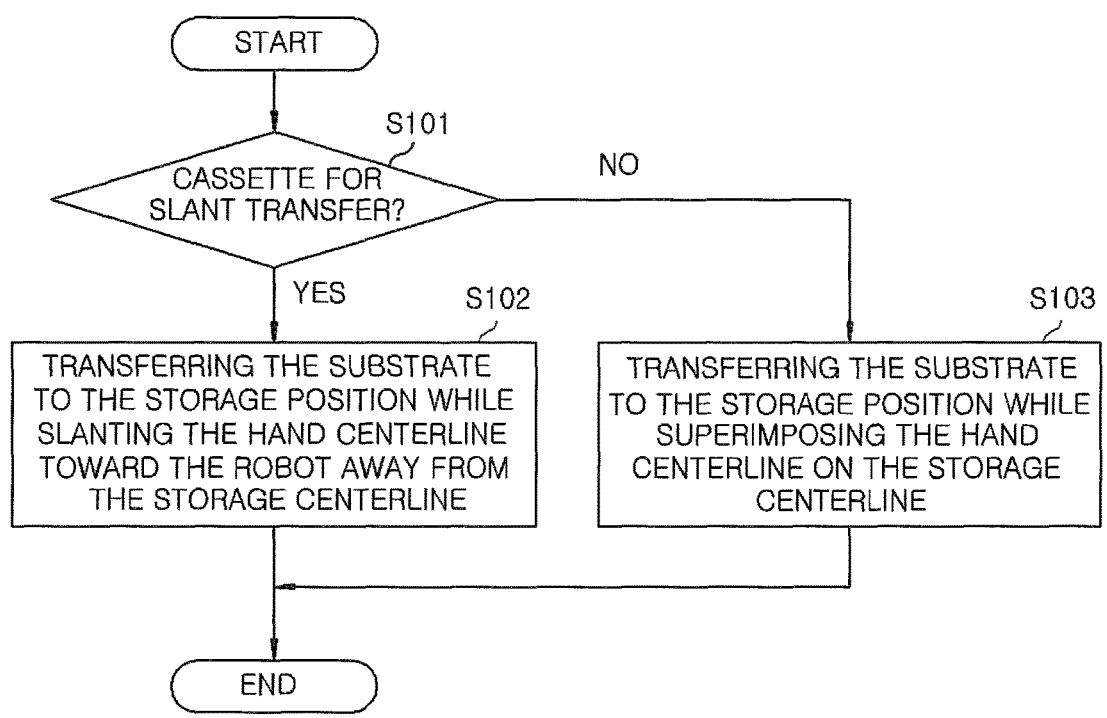
FIG. 12 is a flowchart illustrating a transfer procedure executed by the transfer system.

Next, the transfer procedure performed by the transfer system 1 will be described with reference to FIG. 12. FIG. 12 is a flowchart illustrating the transfer procedure performed by the transfer system 1. The operation controller 21c of the robot control device 20 determines whether the cassette 200 is a cassette 200 for slant transfer (step S101).

If the cassette 200 is a cassette 200 for slant transfer (if Yes at step S101), the substrate 100 is transferred to the storage position 200C while slanting the hand centerline 13CL toward the robot 10 away from the storage centerline 200CL (step S102). Then, the process is terminated.

On the other hand, if the cassette 200 is not a cassette 200 for slant transfer (if No at step S101), namely if the cassette 200 is a cassette 200 for perpendicular transfer, the substrate 100 is transferred to the storage position 200C while superimposing the hand centerline 13CL on the storage centerline 200CL (step S103). Then, the process is terminated.

Figure 13:
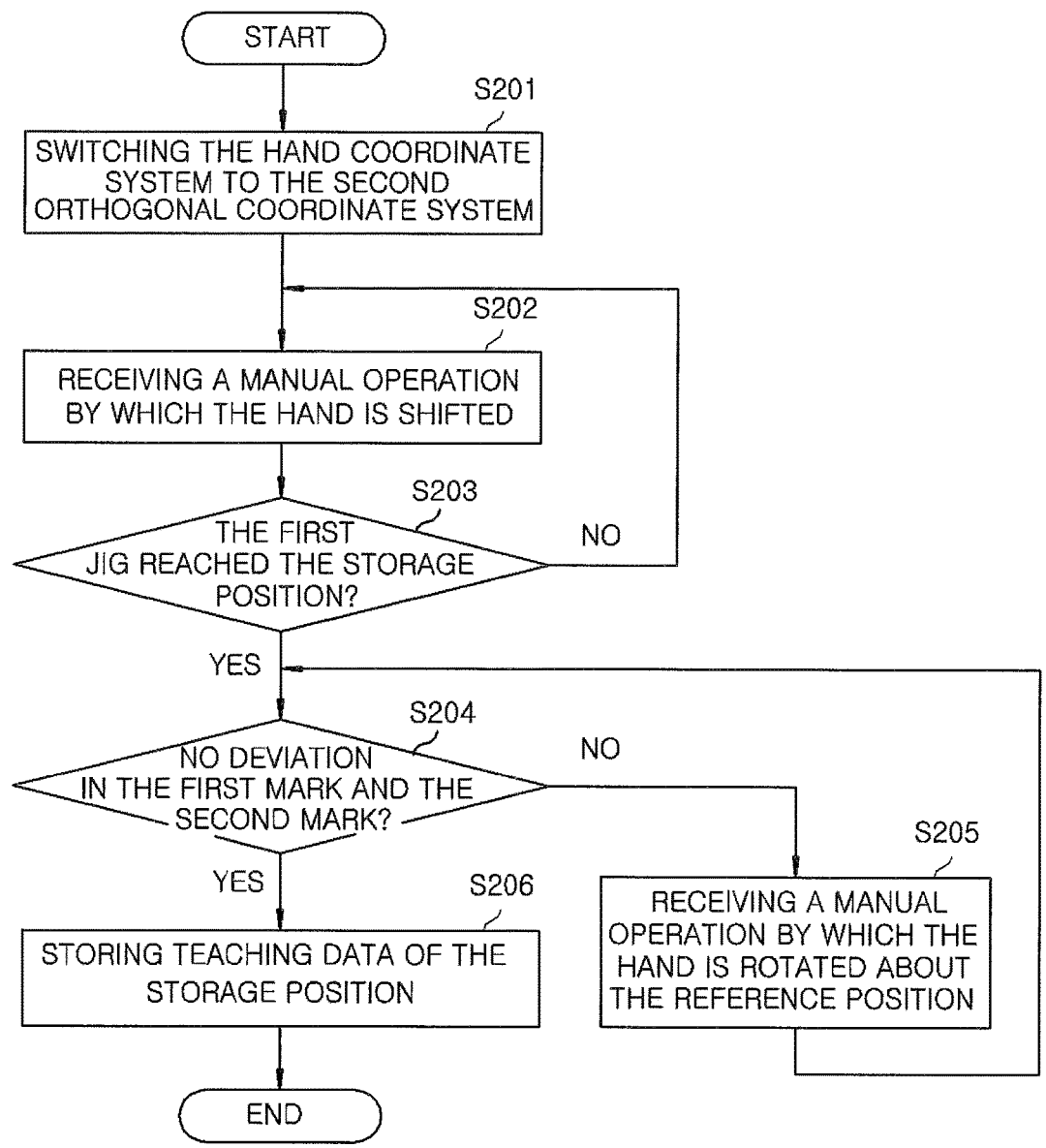
FIG. 13 is a flowchart illustrating a teaching procedure.

Next, the teaching procedure performed by the transfer system 1 will be described with reference to FIG. 13. FIG. 13 is a flowchart illustrating the teaching procedure. Based on the operation with respect to the receptor 32 of the input device 30, the switcher 21b switches the hand coordinate system to the second orthogonal coordinate system (see the $X\alpha Y\alpha$ coordinate system illustrated in FIG. 11) (step S201).

Then, the input device 30 receives a manual operation by which the hand 13 is shifted (step S202). Then, the input device 30 receives an input which indicates whether the first jig 110 has reached the storage position 200C (step S203). If the input device 30 receives an input which indicates that the first jig 110 has reached the storage position 200C (if Yes at step S203), the input device 30 receives an input which indicates whether there is no deviation between the first mark 111 and the second mark 214 (step S204). If the determination condition of step S203 is not met (if No at step S203), the process of step S202 and subsequent steps is repeated.

If the input device 30 receives an input which indicates that there is no deviation between the first mark 111 and the second mark 214 (if Yes at step S204), the teaching data of the storage position 200C are stored (step S206). Then, the process is terminated. On the other hand, if the determination condition of step S204 is not met (if No at step S204), the input device 30 receives a manual operation by which the hand 13 is rotated about the reference position 13C (step S205). Then, the process of step S204 and subsequent steps is repeated.

Figure 14:
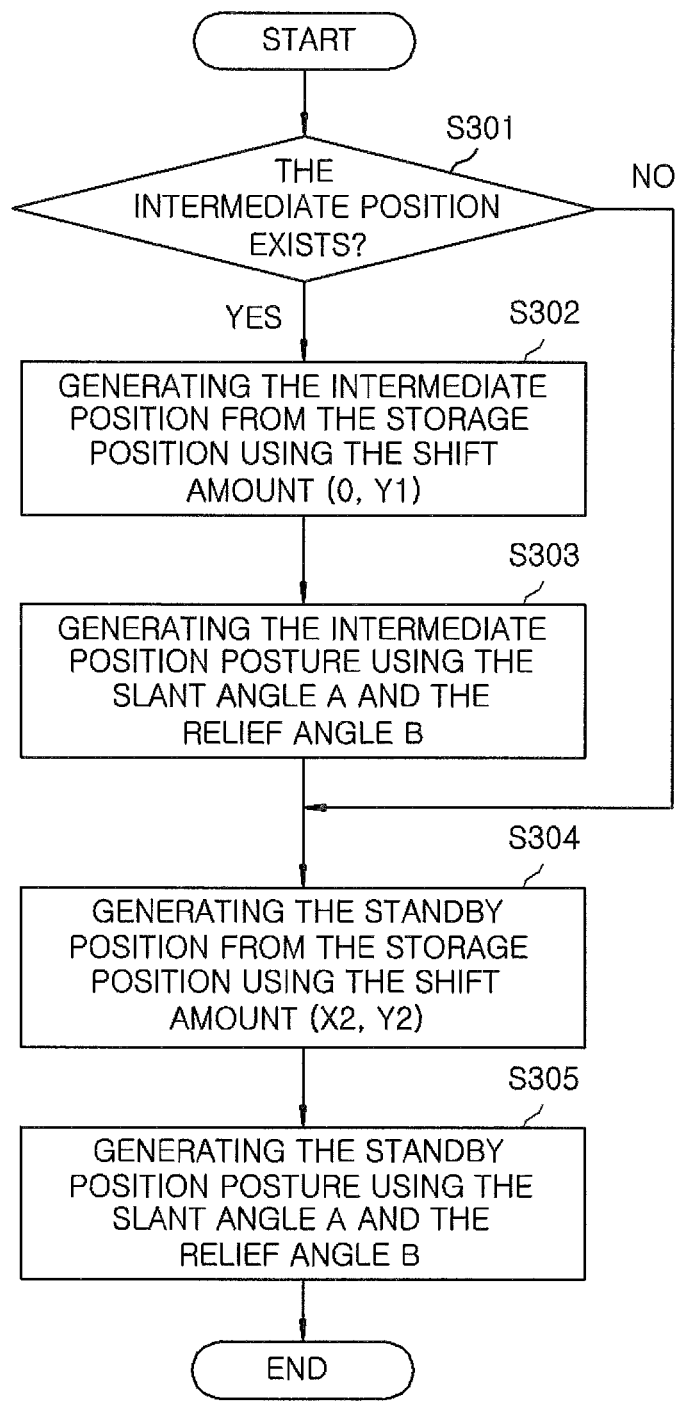
FIG. 14 is a flowchart illustrating a generation procedure of the intermediate position and the standby position.

Next, the generation procedure of the intermediate position P1 and the standby position P2 performed by the transfer system 1 will be described with reference to FIG. 14. FIG. 14 is a flowchart illustrating the generation procedure of the intermediate position P1 and the standby position P2.

Based on the layout of the transfer system 1, the generator 21a determines whether the intermediate position P1 exists (step S301). If the intermediate position P1 exists (if Yes at step S301), the generator 21a generates the intermediate position P1 from the storage position 200C using the shift amounts (0, Y1) (step S302). Furthermore, the generator 21a generates the posture of the hand 13 in the intermediate position P1 using the slant angle $\alpha$ and the relief angle $\beta$ (step S303).

If the determination condition of step S301 is not met (if No at step S301), the process of step S304 and subsequent steps is performed without performing the process of step S302 and step S303.

Subsequently, the generator 21a generates the standby position P2 from the storage position 200C using the shift amounts (X2, Y2) (step S304). Furthermore, the generator 21a generates the posture of the hand 13 in the standby position P2 using the slant angle $\alpha$ and the relief angle $\beta$ (step S305). The, the process is terminated.

If the posture of the robot 10 in the intermediate position P1 or the standby position P2 does not fall within a predetermined permission range, the generator 21a performs notification of an error or a warning and stops the generation of the intermediate position P1 or the standby position P2. This point has already been described with reference to FIG. 9C and, therefore, will not be described here.

As described above, the transfer system 1 according to the present embodiment includes the robot 10, the transfer chamber 50, the cassettes 200 and the robot control device 20. The robot 10 includes the hand 13 configured to transfer the substrate 100. The robot 10 is disposed within the transfer chamber 50. The cassettes 200 are substrate-storing devices disposed side by side on the front sidewall 51 of the transfer chamber 50 in a plan view. The robot control device 20 controls the operation of the robot 10 based on the teaching information 22a.

In a plan view, a line which interconnects the third axis A3 as the rotation axis of the hand 13 and the reference position 13C as the center of the substrate 100 transferred by the hand 13 is defined as a hand centerline 13CL. Furthermore, a line which is perpendicular to the front surface 200F as the transfer-chamber-side surface of each of the cassettes 200 and which passes through the storage position 200C indicating the center of the substrate 100 stored in each of the cassettes 200 is defined as a storage centerline 200CL.

The robot control device 20 includes the operation controller 21c. The operation controller 21c causes the robot 10 to transfer the substrate 100 to the storage position 200C while slanting the hand centerline 13CL toward the robot 10 away from the storage centerline 200CL with respect to at least one of the cassettes 200a and 200e existing at the opposite ends and while superimposing the hand centerline 13CL on the storage centerline 200CL with respect to the remaining cassettes 200b, 200c and 200d.

Accordingly, the transfer system 1 according to the present embodiment transfers the substrate 100 to the storage position 200C by slant transfer. It is therefore not necessary to increase the length of links of the robot 10 or the number of links. That is to say, according to the transfer system 1 of the present embodiment, it is possible to perform efficient transfer without increasing a cost.

As described above, the teaching jigs according to the present embodiment includes the first jig 110 and the second jig 210. The first jig 110 is transferred instead of the substrate 100 by the hand 13 of the robot 10 which transfers the substrate 100. The first jig 110 has a shape which resembles the substrate 100. The first jig 110 includes the first mark 111 which indicates the orientation of the hand 13. The second jig 210 is provided in the front sidewall 51 of the transfer chamber 50 instead of the substrate-storing cassette 200a or 200e to which the substrate 100 is transferred by the robot 10 while slanting the hand 13. The second jig 210 includes the second mark 214 which indicates the orientation of the cassettes 200.

The second mark 214 is provided in a position where the second mark 214 can be compared with the first mark 111 when the first jig 110 is transferred to the storage position 200C of the substrate 100 in each of the cassettes 200 while slanting the hand 13 by a desired slant angle $\alpha$.

Accordingly, according to the teaching jigs of the present embodiment, it is possible to efficiently teach the position or posture of the hand 13 when the slant transfer is performed. In addition, the transfer system 1, the first jig 110 and the second jig 210 may be used as a teaching system.

In the aforementioned embodiment, there is illustrated a case where the length of the short side of the transfer chamber 50 is short and where the robot 10 is disposed close to the front sidewall 51 of the transfer chamber 50. However, the present disclosure is not limited thereto. The transfer system 1 may be applied to a transfer chamber 50 which has such a short side length that the front sidewall 51 and the rear sidewall 52 do not interfere with the robot 10 within the minimum turning range 11a of the robot 10.

Furthermore, in the aforementioned embodiment, there is illustrated a case where the second jig 210 is disposed instead of the cassettes 200 existing at the opposite ends and where the slant transfer for such cassettes 200 is taught to the robot 10. However, the cassettes 200 used as targets of the slant transfer are not limited to the cassettes 200 existing at the opposite ends.

Moreover, in the aforementioned embodiment, there is illustrated a case where the first jig 110 is held by the hand 13 so that the first mark 111 of the first jig 110 lies on the hand centerline 13CL. However, the present disclosure is not limited thereto. The angle between the line, which interconnects the first mark 111 and the reference position 13C, and the hand centerline 13CL may be set at a predetermined angle. In this case, the second mark 214 of the second jig 210 may be provided in a position shifted by the predetermined angle. By doing so, in the case of a desire slant angle α, the first mark 111 and the second mark 214 may be caused to face each other.

In the case where the teaching of the slant transfer is performed with respect to a plurality of cassettes 200 differing in the distance from the installation position of the robot 10, the slant angle α defined depending on the layout of the robot 10, the transfer chamber 50 and the cassettes 200 may be applied to each of the cassettes 200. In the second jig 210 disposed instead of the cassette 200 for which the slant transfer is performed, the second mark 214 may be disposed in a position which conforms to the slant angle α defined for each of the cassettes 200.

Other effects and modifications can be readily derived by those skilled in the art. For that reason, the broad aspect of the present disclosure is not limited to the specific disclosure and the representative embodiments illustrated and described above. Accordingly, the present disclosure can be modified in many different forms without departing from the spirit and scope defined by the appended claims and the equivalents thereof.

It should be understood by those skilled in the art that various modifications, combinations, sub-combinations and alterations may occur depending on design requirements and other factors insofar as they are within the scope of the appended claims or the equivalents thereof.

What is claimed is:

1. A transfer system, comprising:
a robot including a hand configured to transfer a substrate;
a transfer chamber within which the robot is disposed;
a plurality of substrate-storing cassettes disposed side by side on a sidewall of the transfer chamber in a plan view; and
a robot control device configured to control an operation of the robot based on teaching information,
wherein a line which interconnects a rotation axis of the hand and a reference position as a center of the substrate in a plan view, is defined as a hand centerline,
a line which is perpendicular to a front surface as a transfer chamber side surface of each of the cassettes and which passes through a storage position indicating the center of the substrate stored in each of the cassettes, is defined as a storage centerline,
the cassettes include a first cassette and a second cassette, and
the robot control device includes an operation controller configured to cause the robot to transfer the substrate to the storage position while slanting the hand centerline toward the robot away from the storage centerline with respect to the first cassette and while superimposing the hand centerline on the storage centerline with respect to the second cassette, and
with respect to the first cassette, the hand centerline is slanted relative to the storage centerline when the storage position and the reference position of the hand are superimposed.

2. The system of claim 1, wherein the first cassette includes at least one of the cassettes existing at opposite ends.

3. The system of claim 1, wherein the operation controller is configured to cause the robot to perform an operation of rotating the hand about the reference position, when teaching the storage position to the robot.

4. The system of claim 1, further comprising:
a first jig transferred by the hand instead of the substrate and provided with a first mark which indicates orientation of the hand; and
a second jig provided on a sidewall of the transfer chamber,
wherein the second jig is provided with a second mark which indicates orientation of the second jig, the second mark provided in a position where the second mark is comparable with the first mark when the first jig is transferred to a position of the second jig corresponding to the storage position of the substrate in a state in which the hand is slanted by a desired slant angle, and
the robot control device is configured to teach a movement locus of the hand with respect to each of the cassettes using the first jig and the second jig.

5. The system of claim 1, wherein the robot control device includes a generator configured to generate, with respect to the first cassette, the teaching information including a position through which the hand passes when transferring the substrate and a posture in the position, based on a slant angle which is an angle between the hand centerline and the storage centerline in a state in which the reference position is moved to the storage position.

6. The system of claim 5, wherein each of the cassettes is provided therein with an exclusion region in which entry of the hand is prohibited,
the hand is provided at a distal end thereof with a sensor which inspects a storage state of the substrate stored in each of the cassettes, and
the teaching information is generated based on the exclusion region and the storage position, the teaching information including an inspection position in which the storage state of the substrate is inspected by the sensor and a posture of the hand in the inspection position.

7. The system of claim 5, wherein the robot control device includes an interface configured to input the slant angle.

8. The system of claim 5, wherein the robot control device includes a switcher configured to switch, when performing teaching of the robot, a first orthogonal coordinate system which includes a first coordinate axis extending from the reference position toward a distal end of the hand along the hand centerline and a second coordinate axis orthogonal to the first coordinate axis within a horizontal plane, and a second orthogonal coordinate system which is generated by rotating the first orthogonal coordinate system about the reference position until the slant angle becomes 0.

9. The system of claim 8, wherein the robot control device includes a receptor configured to receive the switching of the first orthogonal coordinate system and the second orthogonal coordinate system.

10. The system of claim 5, wherein the teaching information includes an intermediate position which is generated by shifting the storage position toward the transfer chamber along the storage centerline by a predetermined shift amount, and a posture of the hand in the intermediate position, which is generated by adding a predetermined relief angle to the slant angle.

11. The system of claim 10, wherein the teaching information includes information for moving the hand between the storage position and the intermediate position so that a locus of the reference position is superimposed on the storage centerline, while rotating the hand about the reference position.

12. The system of claim 10, wherein the teaching information includes a standby position in which the hand is rotatable about the center axis without causing the substrate under transfer to make contact with the transfer chamber, the standby position generated based on a predetermined shift amount from the storage position.

13. The system of claim 12, wherein the teaching information includes information for moving the hand between the intermediate position and the standby position while maintaining orientation of the hand centerline with respect to the transfer chamber.

14. A transfer method which is performed using a robot including a hand configured to transfer a substrate, a transfer chamber within which the robot is disposed, a plurality of substrate-storing cassettes disposed side by side on a sidewall of the transfer chamber in a plan view, and a robot control device configured to control an operation of the robot based on teaching information, wherein a line which interconnects a rotation axis of the hand and a reference position as a center of the substrate in a plan view, is defined as a hand centerline, a line which is perpendicular to a front surface as a transfer chamber side surface of each of the cassettes and which passes through a storage position indicating the center of the substrate stored in each of the cassettes, is defined as a storage centerline, and the cassettes include a first cassette and a second cassette, the method comprising:

causing the robot to transfer the substrate to the storage position while slanting the hand centerline toward the robot away from the storage centerline with respect to the first cassette; and causing the robot to transfer the substrate to the storage position while superimposing the hand centerline on the storage centerline with respect to the second cassette, wherein, with respect to the first cassette, the hand centerline is slanted relative to the storage centerline when the storage position and the reference position of the hand are superimposed.

15. The method of claim 14, wherein the first cassette includes at least one of the cassettes existing at opposite ends.

16. The method of claim 14, further comprising:

generating, with respect to the first cassette, the teaching information including a position through which the hand passes when transferring the substrate and a posture in the position, based on a slant angle which is an angle between the hand centerline and the storage centerline in a state in which the reference position is moved to the storage position.

* * * * *